(12) United States Patent  
Saggio et al.

(10) Patent No.: US 8,039,898 B2
(45) Date of Patent: Oct. 18, 2011

(54) PROCESS FOR MANUFACTURING A CHARGE-BALANCE POWER DIODE AND AN EDGE-TERMINATION STRUCTURE FOR A CHARGE-BALANCE SEMICONDUCTOR POWER DEVICE

(75) Inventors: Mario Giuseppe Saggio, Aci Castello (IT); Domenico Murabito, Catania (IT); Ferruccio Frisina, Sant'Agata Li Battiati (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 184 days.

(21) Appl. No.: 11/824,169

(22) Filed: Jun. 28, 2007

(65) Prior Publication Data

US 2008/0001223 A1  Jan. 3, 2008

(30) Foreign Application Priority Data

Jun. 28, 2006  (EP) ..................................... 06425448

(51) Int. Cl.
*H01L 29/66* (2006.01)
(52) U.S. Cl. ................ 257/341; 257/328; 257/E29.013; 257/E29.012; 438/134; 438/337; 438/270
(58) Field of Classification Search .................. 257/327, 257/328, E29.013, E29.012; 438/134, 337, 438/270
See application file for complete search history.

(56) References Cited

U.S. PATENT DOCUMENTS

| 4,242,690 | A |   | 12/1980 | Temple |
| 6,054,748 | A | * | 4/2000  | Tsukuda et al. ............... 257/496 |
| 6,228,719 | B1 |  | 5/2001  | Frisina et al. |
| 6,300,171 | B1 |  | 10/2001 | Frisina |

(Continued)

FOREIGN PATENT DOCUMENTS

CN  1663050  6/2003

(Continued)

OTHER PUBLICATIONS

European Search Report for EP 06 42 5448 dated Jan. 19, 2007.

*Primary Examiner* — Thanh V Pham
*Assistant Examiner* — Mark A Laurenzi
(74) *Attorney, Agent, or Firm* — Lisa K. Jorgenson; Kevin D. Jablonski; Graybeal Jackson LLP (57) ABSTRACT

An embodiment of a process for manufacturing a semiconductor power device envisages the steps of: providing a body made of semiconductor material having a first top surface; forming an active region with a first type of conductivity in the proximity of the first top surface and inside an active portion of the body; and forming an edge-termination structure. The edge-termination structure is formed by: a ring region having the first type of conductivity and a first doping level, set within a peripheral edge portion of the body and electrically coupled to the active region; and a guard region, having the first type of conductivity and a second doping level, higher than the first doping level, set in the proximity of the first top surface and connecting the active region to the ring region. The process further envisages the steps of: forming a surface layer having the first type of conductivity on the first top surface, also at the peripheral edge portion, in contact with the guard region; and etching the surface layer in order to remove it above the edge portion in such a manner that the etch terminates inside the guard region.

34 Claims, 8 Drawing Sheets

U.S. PATENT DOCUMENTS

| | | |
|---|---|---|
| 6,404,010 B2 | 6/2002 | Saggio et al. |
| 6,586,798 B1 | 7/2003 | Frisina |
| 7,592,668 B2 * | 9/2009 | Kocon .................. 257/335 |
| 2003/0178672 A1 | 9/2003 | Hatakeyama |
| 2004/0016959 A1 | 1/2004 | Yamaguchi |
| 2005/0221547 A1 | 10/2005 | Yamauchi |
| 2006/0220156 A1 * | 10/2006 | Saito et al. .................. 257/409 |

FOREIGN PATENT DOCUMENTS

| | | |
|---|---|---|
| IT | 0600244 | 4/2006 |
| IT | 0600273 | 4/2006 |
| WO | WO 02/49114 A2 | 6/2002 |
| WO | 2004001854 A2 | 12/2003 |

* cited by examiner

PROCESS FOR MANUFACTURING A CHARGE-BALANCE POWER DIODE AND AN EDGE-TERMINATION STRUCTURE FOR A CHARGE-BALANCE SEMICONDUCTOR POWER DEVICE

PRIORITY CLAIM

This application claims priority from European patent application No. 06425448.5, filed Jun. 28, 2006, which is incorporated herein by reference.

TECHNICAL FIELD

An embodiment of the present invention relates to a process for manufacturing a bipolar power diode comprising charge-balance columnar structures, and relates to an edge-termination structure for a semiconductor power device, also comprising charge-balance columnar structures.

BACKGROUND

As is known, in the last few years a wide range of solutions has been developed for increasing the efficiency of semiconductor power devices, in particular in terms of increase in the breakdown voltage and decrease in the output resistance.

For example, U.S. Pat. Nos. 6,586,798, 6,228,719, 6,300,171 and 6,404,010, which are incorporated by reference, describe vertical-conduction semiconductor power devices, in which columnar structures of opposite conductivity are formed inside an epitaxial layer, forming part of a drain region having a given type of conductivity. The columnar structures have a dopant concentration which is substantially the same as, and of a type opposite to, the dopant concentration of the epitaxial layer in such a way as to provide a substantial charge balance (the so-called "Multi Drain (MD) technology"). The charge balance enables high breakdown voltages to be obtained, and moreover the high dopant concentration of the epitaxial layer enables a low output resistance (and low losses in conduction) to be achieved.

In brief, the formation of the aforesaid columnar structures envisages a sequence of steps of growth of N-type epitaxial layers, each step being followed by a step of implantation of a P-type dopant. The implanted regions are stacked so as to form the columnar structures. Next, body regions of the power device are formed in contact with the columnar structures, in such a manner that the columnar structures constitute an extension of the body regions into the drain region.

The evolution of this technology has witnessed a progressive increase in the density of the elementary strips forming the devices, for further increasing the charge concentration in the epitaxial layer and obtaining devices that, given the same breakdown voltage (which is substantially related to the height of the columnar structures), have a lower output resistance. On the other hand, however, the increase in the density of the elementary strips has led to a reduction of the thermal budget of the devices and a corresponding increase in the number of steps of epitaxial growth, and accordingly to an increase in the manufacturing costs and times, and in the defectiveness intrinsically linked to epitaxial growth.

Alternative technologies have consequently been developed to obtain charge-balance columnar structures; these technologies envisage, for example, formation of trenches inside the epitaxial layer and subsequent filling of the trenches with semiconductor material appropriately doped to obtain the charge balance.

For instance, in co-pending patent applications WO-PC-TIT0600244, filed on Apr. 11, 2006, and WO-PC-TIT0600273, filed on Apr. 21, 2006, both in the name of the present applicant and incorporated by reference, improved techniques (which will in part be referred to in what follows) have been described for the formation of trenches and their filling, in particular substantially free from residual defectiveness, to obtain charge-balance structures, and for the formation of semiconductor power devices provided with the charge-balance structures. In particular, in WO-PC-TIT0600273 a non-selective epitaxial growth inside the trenches is proposed, also affecting a top surface of the layer in which the trenches are formed. Consequently, at the end of the epitaxial process a wrinkled surface layer made of semiconductor material may be formed, characterized by the presence of a plurality of grooves in areas corresponding to the columnar structures. It is also proposed to form the power devices at least in part inside this wrinkled surface layer.

Furthermore, as is known, the provision of efficient edge-termination structures is a key point for ensuring proper operation of power devices; in fact, it is in the edge areas that the largest number of breakdowns occur on account of the concentration of the electrical field lines due to the curvature of the edge regions. The edge terminations have the function of locally reducing the intensity of the electrical field so as to prevent peaks of intensity at the edges.

So far, the problem of providing edge-termination structures for charge-balance power devices, which enable maximization of the performance in reverse biasing of said devices, has not yet been solved in a satisfactory way for all applications.

SUMMARY

One or more embodiments of the present invention further improve the techniques for producing charge-balance power devices, in particular for the producing a bipolar power diode, and are directed to an efficient edge-termination structure for the aforesaid devices, based upon the power diode.

BRIEF DESCRIPTION OF THE DRAWINGS

One or more embodiments of the invention are now described, purely by way of non-limiting example and with reference to the drawings, wherein.

DETAILED DESCRIPTION

A process for manufacturing a semiconductor power diode with charge-balance techniques is now described according to one or more embodiments of the invention. As will be clarified hereinafter, the structure that is obtained can be used, with the appropriate modifications, to obtain an edge structure for a generic charge-balance power device (for example, a MOSFET, a BJT, etc.).

Figure 1:
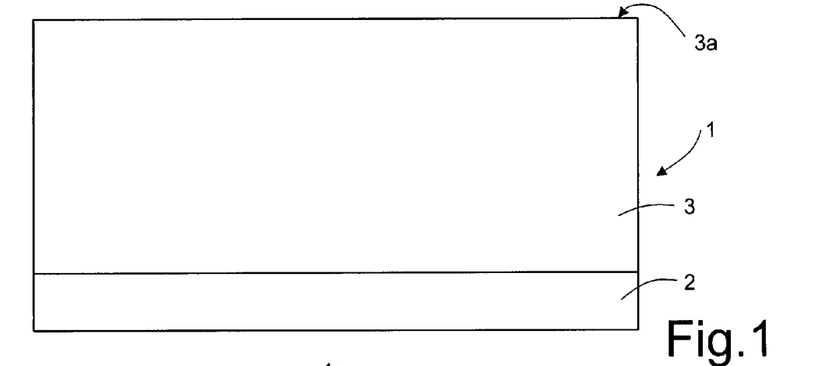
FIG. 1 shows a cross section through a wafer made of semiconductor material in an initial step of a manufacturing process of a power diode and of a corresponding edge-termination structure, according to a first embodiment of the present invention.

FIG. 1 shows a wafer 1 made of semiconductor material, typically silicon, comprising a substrate 2 having a first type of conductivity, for example of an $N^{++}$ type with resistivity lower than 10 mΩ·cm, and an epitaxial layer 3, also having the first type of conductivity, for example of an N type with resistivity of between 0.1 Ω·cm and 2 Ω·cm. The wafer 1 has, for example, surface orientation <100>, and the epitaxial layer 3 has a top surface 3a.

In an initial step of the manufacturing process (FIGS. 2 and 3), a first implantation is performed of dopant atoms with a second type of conductivity, in the example a P-type conductivity (with boron atoms), to form a first doped region 4 in the proximity of the top surface 3a of the epitaxial layer 3. As will be clarified hereinafter, the first doped region 4 is to form an anode region of a power diode, and part of a corresponding edge-termination structure (in particular a guard ring). In detail, an implantation is performed with high dose (of between $5·10^{13}$ and $3·10^{15}$ at/cm$^2$) and medium energy (of between 80 and 160 keV), through a first mask (not illustrated) of appropriate shape, so as to localize the implantation in an active area of the power device and in a perimetral region of the same active area (at the boundary with a corresponding edge region). For example, the first doped region 4 has in plan view a closed generally rectangular shape (as may be seen in FIG. 2).

Figure 2:
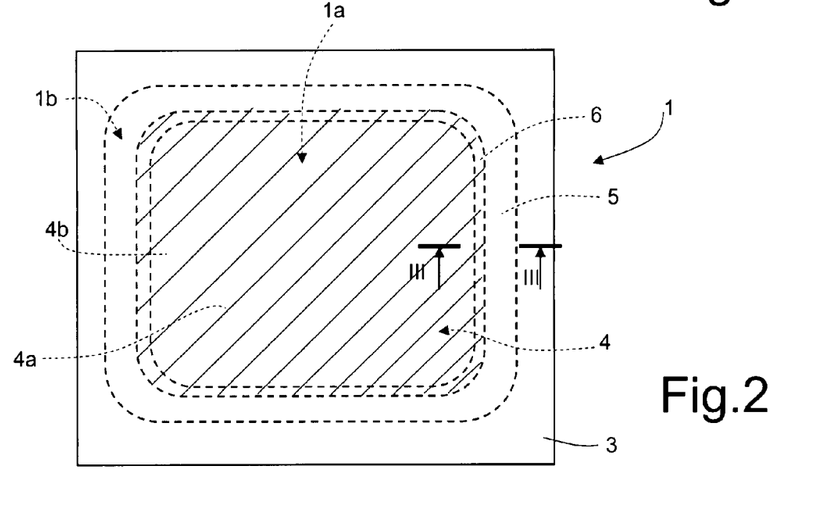
FIG. 2 shows a top plan view of the wafer of FIG. 1 in a subsequent step of the manufacturing process.
Figure 3:
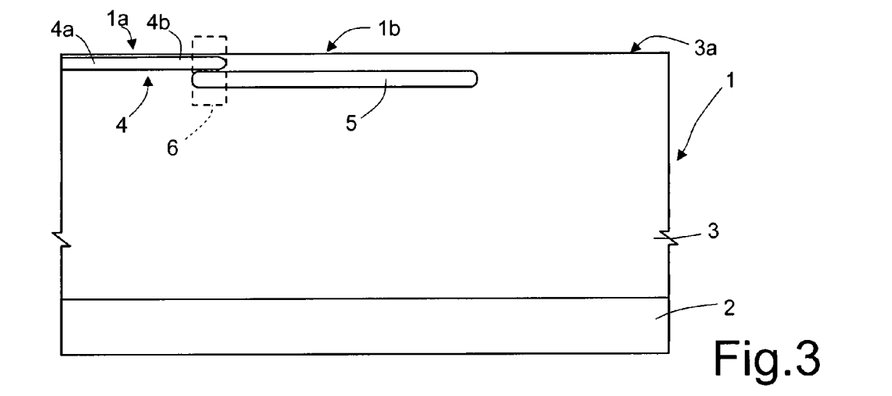
FIGS. 3 to 10 show cross sections through the wafer of semiconductor material along the line of section III-III of FIG. 2, in subsequent steps of the manufacturing process.

A second implantation of dopant atoms of a P type is then performed through a second mask (not illustrated) to form a ring region 5 of the edge-termination structure of the power device. The implantation, which in the example is also performed with boron atoms, is at a low dose (of between $5·10^{11}$ and $8·10^{12}$ at/cm$^2$) and high energy (of between 120 keV and 1 MeV). It follows that the ring region 5 is set at a depth lower than that of the first doped region 4 with respect to the top surface 3a of the epitaxial layer 3. In particular, the second mask locates the ring region 5 in the perimetral region of the power device. In detail, the ring region 5 completely surrounds the first doped region 4 and has an area of overlapping 6 with the latter (indicated by the dashed line). It is consequently possible to distinguish in the wafer 1 an active area 1a, which is designed for providing active devices (in the example the power diode), and set in which is an active portion 4a of the first doped region 4; and an edge area 1b, which is designed for providing an edge-termination structure, and set in which are an edge portion 4b of the first doped region 4, and the ring region 5.

Next (FIG. 4), charge-balance columnar structures 7 are formed through the epitaxial layer 3, and accordingly also through the already implanted regions, i.e., the first doped region 4 and the ring region 5, substantially as described in detail in the aforesaid co-pending patent applications WO-PCTIT0600244, and WO-PCTIT0600273.

Figure 4:
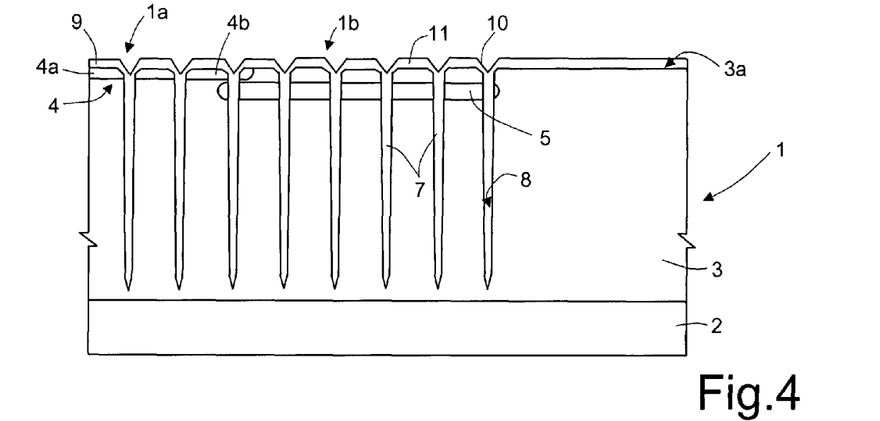

In summary, the process for the formation of the columnar structures 7 envisages first the formation, by means of anisotropic dry etching through an appropriate masking, of deep trenches 8 inside the epitaxial layer 3 (and through the first doped region 4 and the ring region 5). The deep trenches 8 have, for example, a width, at the level of the top surface 3a, of between 0.8 and 2 μm and a smaller width at their bottom of between 0.2 and 1.4 μm. In addition, the height of the deep trenches 8 varies, for example, between 5 and 50 μm and determines, together with the thickness of the epitaxial layer 3, the voltage class of the final device (by way of example, corresponding to a height of 5 μm is a voltage class of 100 V, whereas corresponding to a height of 30 μm is a voltage class of 600 V). Then, the wafer 1 is subjected to an annealing treatment in a hydrogen environment at a temperature of 1000-1150° C. for a treatment time of 1-15 min. This treatment, in addition to eliminating the damage due to the preceding etching, leads to exposure, on the bottom of the deep trenches 8 of the crystallographic planes <100> and <130> and, along the side walls of the plane <010> (the deep trenches 8 consequently assume the shape visible in FIG. 4). Next, the deep trenches 8 are filled via epitaxial growth with silicon doped with the second type of conductivity, in one example of a P type with boron ions. In particular, the epitaxial growth occurs by supplying a flow of a gas containing silicon (for example, dichlorosilane) and of a gas containing boron (for example, diborane), and the doping control is ensured by maintaining a constant gradient of growth in the flow of diborane (for example, by setting a linear ramp increasing between an initial flow and a final flow of a value twice that of the initial one), and maintaining the flow of dichlorosilane constant. Given that the growth is not selective with respect to the deep trenches 8, the epitaxial growth is performed both inside the trenches, starting from the side walls, with a faster rate in the proximity of the surface, and outside the trenches, in particular on the top surface 3a of the epitaxial layer 3. In order to prevent premature closing of the deep trenches 8 because of the encounter of the fronts of growth from the walls, successive steps are alternated of epitaxial growth and etching, for example with HCl, of the portions of surface growth (the so-called "multi-step" process). At the end of this process sequence, the structure shown in FIG. 4 is obtained, with the formation of the columnar structures 7, which completely fill the deep trenches 8 and have a uniform doping spatial distribution and reduced presence of defects (for example, voids). The process of non-selective epitaxial growth also affects the top surface 3a of the epitaxial layer 3, on top of which a wrinkled surface layer 9 of a P type is formed, with grooves in areas corresponding to the columnar structures 7. In particular, each columnar structure 7 has a surface extension 10 at and on the top surface 3a having a non-planar surface pattern and a characteristic grooved, in particular V-shaped, cross section. Connection portions 11 of the wrinkled surface layer 9, having a planar surface pattern, connect the surface extensions 10 of adjacent columnar structures 7.

According to an embodiment of the present invention (FIG. 5), a further phototechnique (which comprises a masking and a subsequent etching) is then carried out to eliminate a portion of the wrinkled surface layer 9 in a position corresponding to the edge region 1b, or in an equivalent way to the ring region 5. The etch also involves a surface portion of the epitaxial layer 3 so that the surface of the epitaxial layer above the ring region 5 is planarized and is at a lower level with respect to the active area 1a of the device (in which the wrinkled surface layer 9 remains). Consequently, above the ring region 5 a planar surface 3b is defined, set at a lower level with respect to the top surface 3a of the original epitaxial layer 3.

Figure 5:
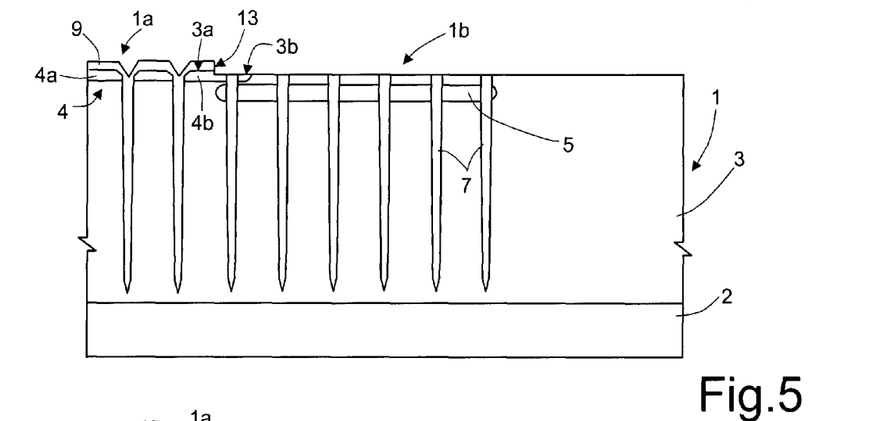

The aforesaid etch involves also part of the first doped region 4 in a position corresponding to the area of overlapping 6 and is calibrated in such a manner as to stop inside the same doped region, thus forming a step 13 inside its edge portion 4b. This step 13 connects the top surface 3a with the planar surface 3b, and is set around the entire active area 1a of the power device. Equivalently, the first doped region 4 has a given thickness at its active portion 4a, and a smaller thickness at an end area of its edge portion 4b, beyond the step 13.

The fact that the etch step terminates at the first doped region 4 (having a high doping level) improves the stability of the breakdown of the power device, preventing dangerous concentrations of the electrical field lines. In fact, in reverse biasing, the electrical field lines are not able to reach the sharp edge of the etch, which is protected by the $P^+$ junction. Basically, the edge portion 4b of the first doped region 4, in addition to electrically connecting the ring region 5 to an active region of the power device, represents a guard ring for the power device, which enables prevention of undesirable effects (in terms of concentration of electrical field) of the step resulting from etching of the wrinkled surface layer.

Figure 6:
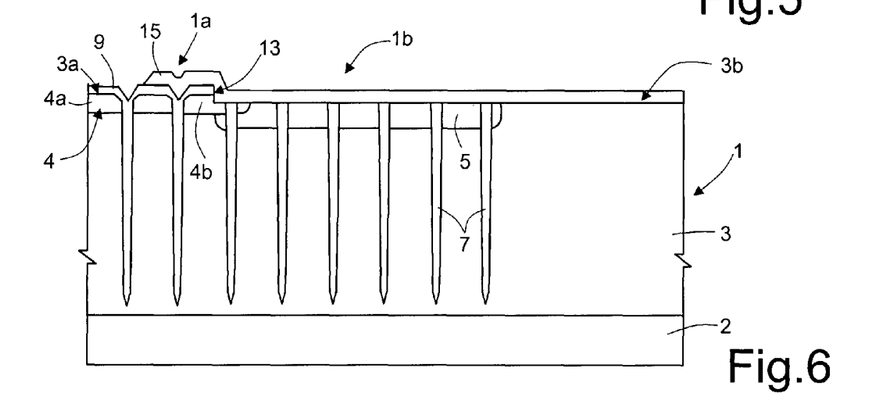

Next, FIG. 6, a field-oxide layer 15 is grown on top of the wafer 1, and the active area 1a is defined by etching the field-oxide layer 15 on the active area 1a. The field oxide consequently remains only on the edge area 1b, and in particular on the edge portion 4b of the first doped region 4 (in which it has the non-planar surface pattern of the underlying wrinkled surface layer 9), and on the ring region 5 (in which it has, instead, a planar surface pattern at a lower level). The thermal process linked to the field oxide growth (at the expense of the exposed silicon) also causes an extension of the previously implanted regions. In particular, the ring region 5 extends as far as the planarized surface 3b, and joins an end part of the edge portion 4b.

Figure 7:
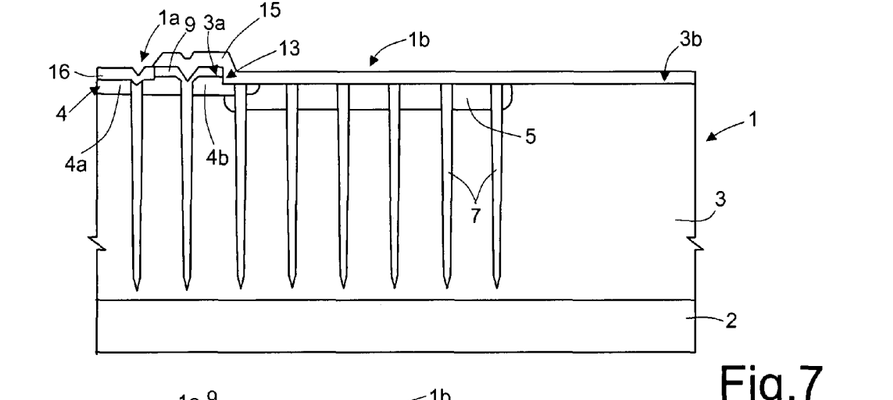

The manufacturing process of the power diode then proceeds with an enrichment implantation in the active area 1a of a P type (for example, once again with boron atoms), with an implantation dose of between $1 \cdot 10^{13}$ and $5 \cdot 10^{14}$ at/cm$^2$ and energy of between 80 and 200 keV, in order to provide an enrichment region 16 in a surface portion of the wafer (and in particular inside the wrinkled surface layer 9) (FIG. 7). The enrichment region 16 has the function of improving a contact that will be subsequently formed at the anode region of the power diode. The implantation can possibly be carried out through an appropriate sacrificial-oxide layer previously deposited in the active area (ion-pre-implantation oxide). There follows in any case a thermal diffusion process.

Figure 8:
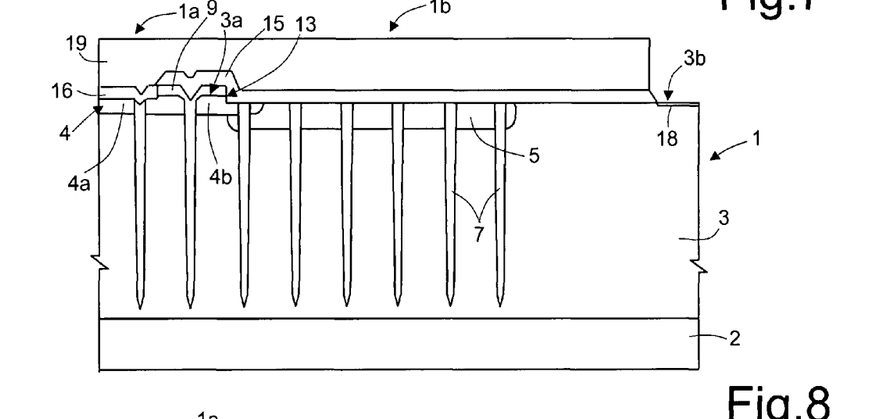

Next (FIG. 8), at an outer periphery of the device, beyond the edge area 1b (for example, at the points of cutting of the wafer to define dice containing the power devices), a second doped region 18, of a $N^{++}$ type at high dosage, is formed in the proximity of the surface of the wafer (the planarized surface 3b). In detail, an appropriate implantation mask 19 is first formed, coating both the active area 1a and the edge area 1b, leaving only the aforesaid periphery of the device exposed. Then the insulating layer 15 is etched, and the second doped region 18 is implanted. In particular, the second doped region 18 has the function of bringing to the surface the cathode potential of the power diode (the cathode being constituted by the epitaxial layer 3) so as to limit the lines of the electrical field horizontally in reverse biasing. Next, the implantation mask 19 is removed from the wafer, and the second doped region 18 is activated.

Figure 9:
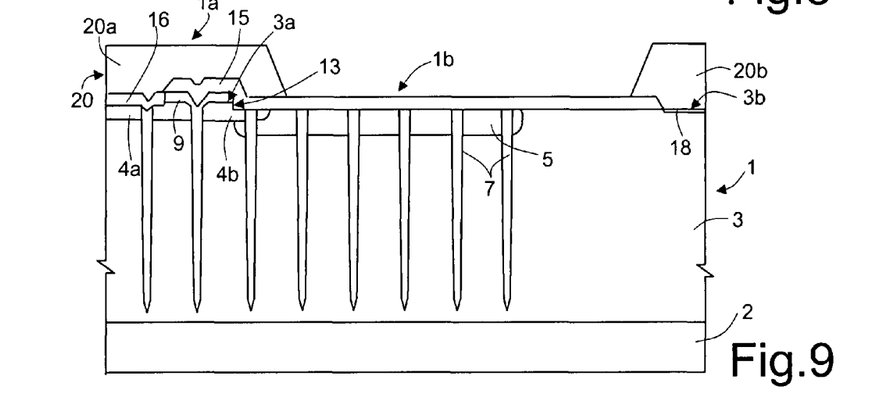

There follows (FIG. 9) a sputtering process to form a front metallization layer 20 on the wafer, the thickness of which depends upon the current-carrying capacity that it is intended to specify for the device. The front metallization layer 20 is then etched so as to define a first contact region 20a for the anode (in contact with the enrichment region 16), and a second contact region 20b for the cathode of the diode (in contact with the second doped region 18).

Figure 10:
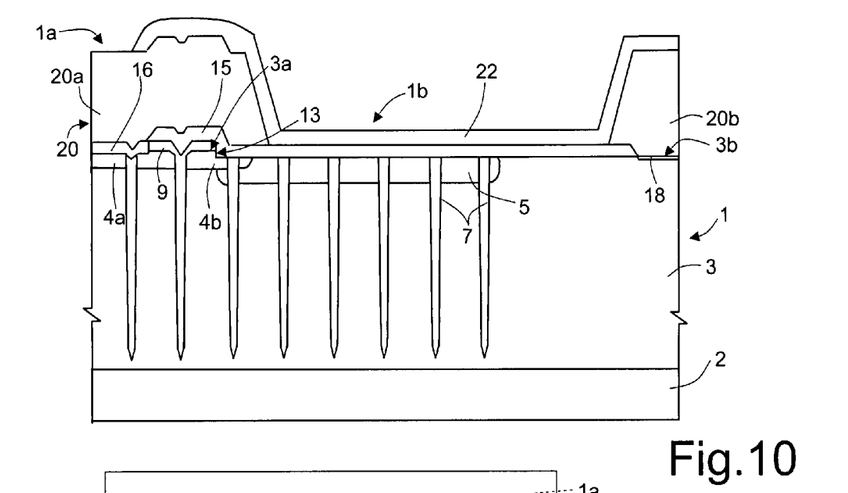

A passivation layer 22 is then deposited on the wafer (FIG. 10) and next it is defined via an appropriate masking so as to open contact windows for the first and second contact regions 20a, 20b. The process terminates with finishing of the back (of a known type), and cutting of the wafer to obtain the various dice containing the power devices.

Figure 11:
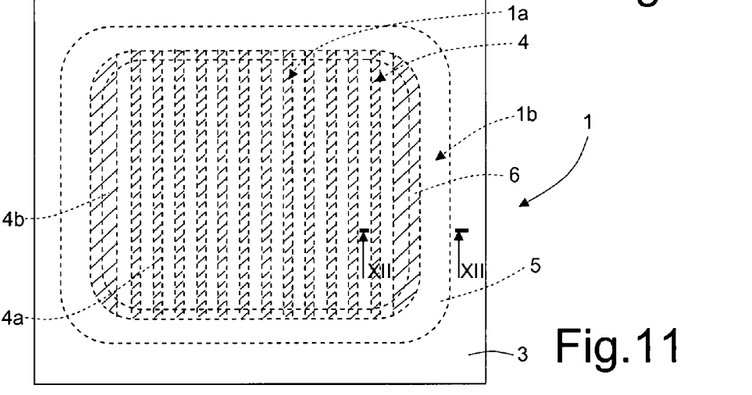
FIG. 11 shows a top plan view of a wafer of semiconductor material similar to that of FIG. 2, corresponding to an embodiment of the present invention.
Figure 12:
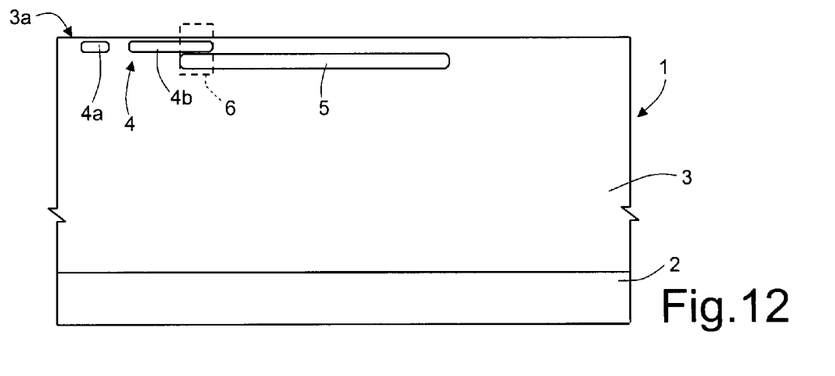
FIGS. 12 and 13 show cross sections through the wafer of semiconductor material along the line of section XII-XII of FIG. 11 in an initial step and in a final step of the manufacturing process, respectively.

According to a second embodiment of the present invention (FIGS. 11 and 12), the first doped region 4 has, in the active area 1a, a strip-like configuration. In this case, the active portion 4a is formed by a plurality of strips extending all in a same direction, parallel to one another. The strips, in the edge area 1b, are connected to the edge portion 4b, which once again overlaps the ring region 5 at the area of overlapping 6.

Figure 13:
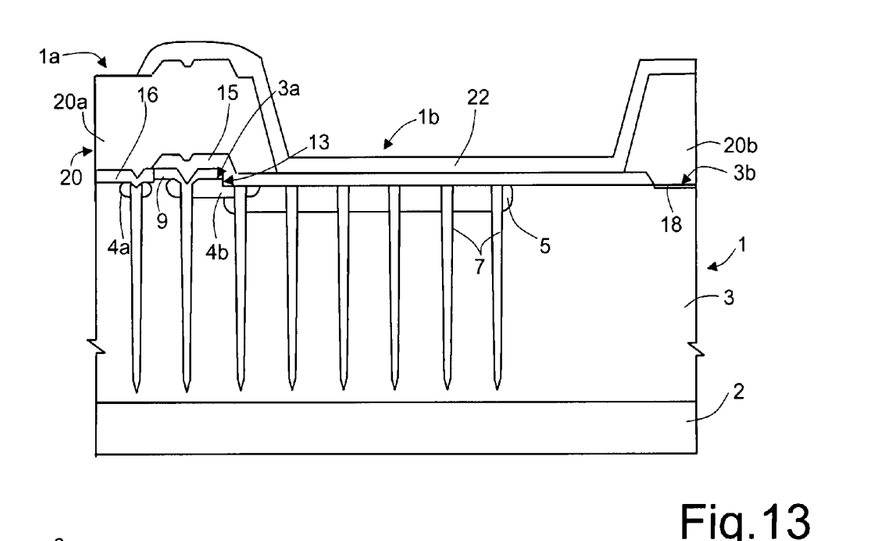

The manufacturing process of the power diode is substantially equivalent to what has been previously described, with the difference that the active portion 4a is not continuous, and a charge-balance columnar structure 7 is located inside each strip. Shown in FIG. 13 is the resulting structure at the end of the process, in which the characteristic edge-termination structure may be recognized, comprising the edge portion 4b of the first doped region 4, in which the step 13 due to etching of the wrinkled surface layer 9 is located, and the ring region 5. Also in this case, the final structure has a different level/plane for the active anode region and the edge-termination region, which are connected by the step 13.

The diode edge-termination structure previously described can be used for a generic charge-balance power device, for example a MOSFET. The manufacturing process of a charge-balance MOSFET is described in detail in the aforesaid copending patent application WO-PCTIT0600273, and is hereinafter briefly presented, in two variants, showing its integration with the described edge-termination structure. In both cases, the MOSFET is formed on a non-planar surface partially inside the wrinkled surface layer 9, exploiting portions of said layer, in particular the surface extensions 10 of the columnar structures 7, as active areas of the device.

Figure 14A:
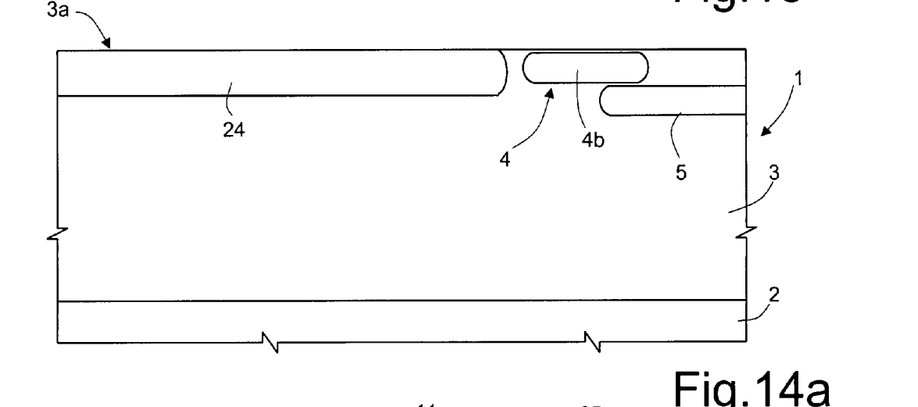
FIGS. 14a-14f show cross sections of a wafer of semiconductor material in successive steps of a manufacturing process of a semiconductor power device, in particular a MOSFET, and of a corresponding edge-termination structure in accordance with a second embodiment of the invention.

A first variant initially envisages (FIG. 14a) execution, in the active area, of a surface implant, of an N type with low energy, to form a surface-implantation layer 24 in the proximity of the top surface 3a of the epitaxial layer 3. The implantation is made prior to the formation of the columnar structures 7 and, for example, after the formation of the first doped region 4 and of the ring region 5 in the edge area 1b. It should be noted that, in this case, the first doped region 4 does not extend in the active area and comprises only the edge portion 4b.

The process proceeds with the steps described previously in FIGS. 4 to 6, concerning the edge-termination structure, namely, with formation of the columnar structures 7, etching of the wrinkled surface layer 9 in the edge area 1b and consequent definition of the step 13, and formation of the field-oxide layer 15.

Figure 14B:
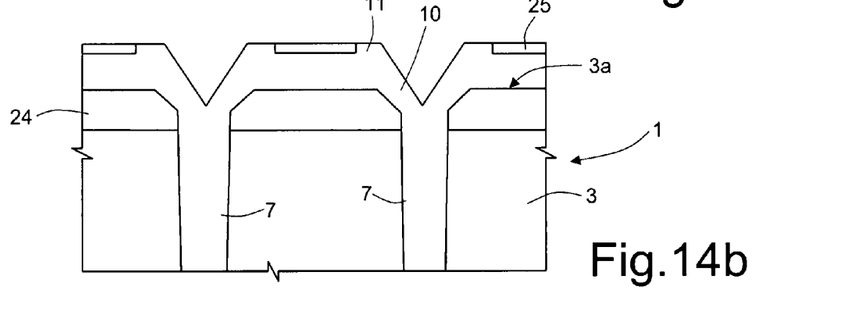

Next (FIG. 14b, showing an enlarged portion of the active area, to which the subsequent process steps refer), in a surface region of the connection portions 11, between adjacent surface extensions 10 of the columnar structures 7, N-type implantations are carried out to form surface contact regions 25.

Figure 14C:
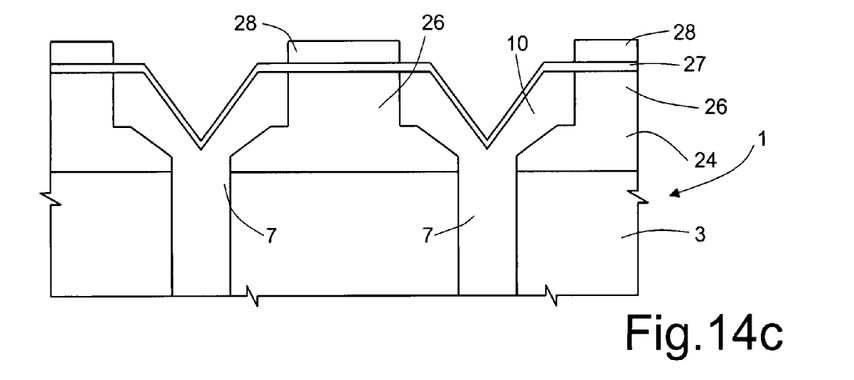

This is followed (FIG. 14c) by a thermal diffusion process for definition of sinkers 26 of an N type, which reverse the conductivity of the respective connection portions 11 and reach the underlying surface-implantation layer 24, also of an N type. On the wafer, once again limitedly to the active area, a gate-oxide layer 27 is then grown, on top of which a polysilicon layer is deposited and subsequently etched so as to obtain gate regions 28 at the top of the sinkers 26.

Figure 14D:
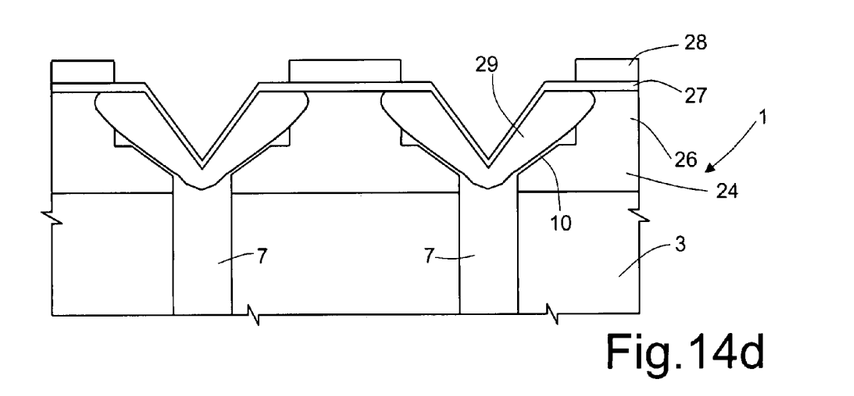

Next (FIG. 14d), a P-type body implantation is carried out, through the gate-oxide layer 27 and exploiting the gate regions 28 as "hard mask", which is followed by a thermal diffusion process, to form body regions 29. The latter extend inside the surface extensions 10 of the columnar structures 7, consequently reproducing the non-planar profile thereof with grooved cross section, and partially inside the sinkers 26 beneath the gate regions 28 (where they form channel regions of the transistor).

Figure 14E:
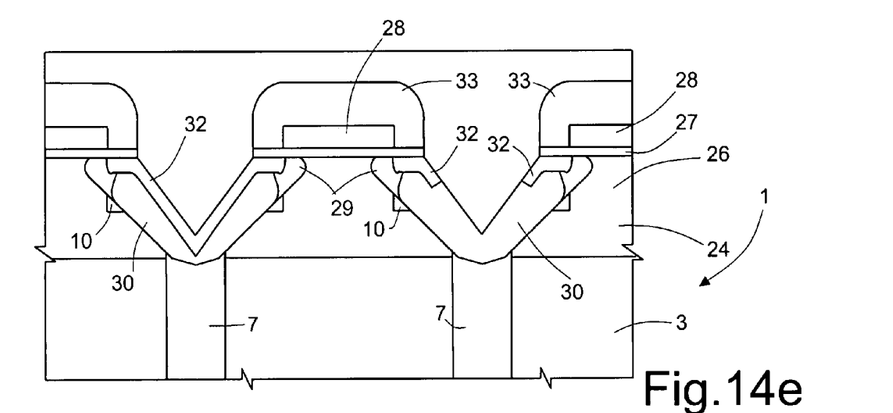

A $P^{++}$-type deep-body implantation is then carried out (FIG. 14e), having, for example, the same characteristics (in terms of energy and dose) as those of the implantation leading to formation of the first doped region 4. This is followed by a thermal diffusion process to form deep-body regions 30 in a central area of the surface extensions 10. Next, a $N^+$-type source implantation is carried out to form source regions 32 inside the body regions 29 and deep-body regions 30. This is followed by a process of deposition and definition of a dielectric layer to form insulating regions 33 on the gate regions 28, and opening of contacts. At the end of the manufacturing process, a power MOS transistor is consequently obtained on a non-planar surface, with a gate oxide and gate region in a planar area and a body region in a non-planar area (in particular made inside the surface extension of a charge-balance columnar structure).

Figure 14F:
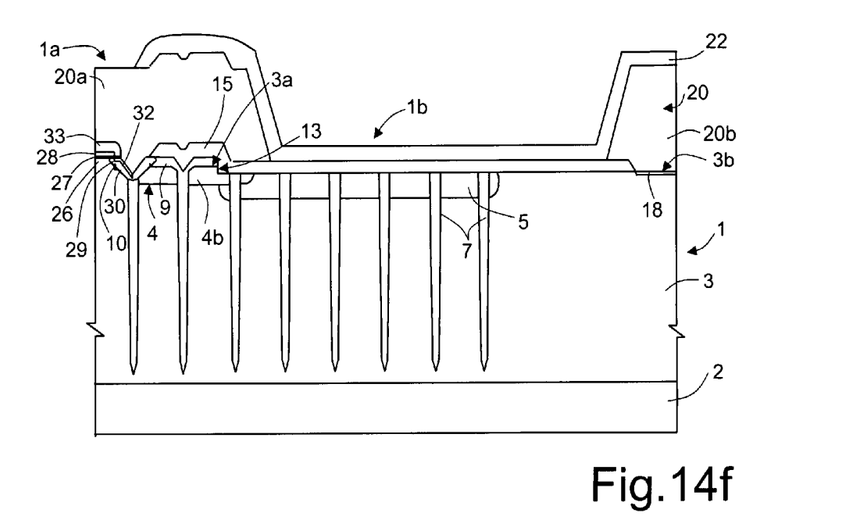

FIG. 14f shows the final structure of the MOSFET with the corresponding edge structure, obtained with final steps of formation of the second doped region 18 for the cathode contact, of metallization, and of passivation, in a way similar to what has been described previously. In particular, the deep-body region 30 of the last active cell (or stripe) of the transistor is connected to the edge portion 4b of the first doped region 4 (anode of the diode of the edge termination).

A second variant of the manufacturing process of a charge-balance MOSFET initially envisages the process steps described with reference to FIGS. 3 to 6 concerning the edge-termination structure, namely, with formation of the edge portion 4b of the first doped region 4 (which once again does not extend into the active area) and of the ring region 5; formation of the columnar structures 7; etching of the wrinkled surface layer 9 in the edge area 1b and consequent definition of the step 13; and formation of the field-oxide layer 15.

Figure 15A:
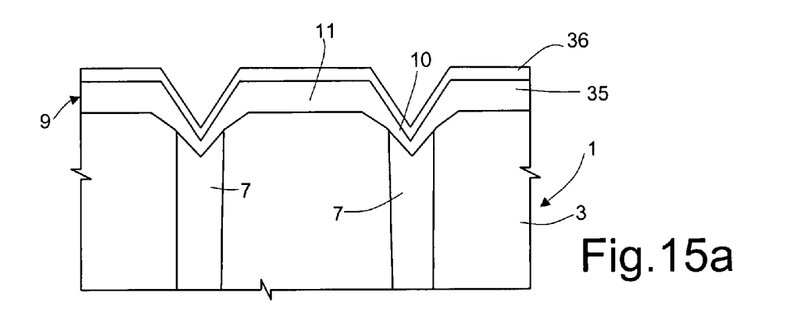
FIGS. 15a-15e show cross sections of a wafer of semiconductor material in successive steps of a manufacturing process of a semiconductor power device and of a corresponding edge-termination structure in accordance with a third embodiment of the invention.

In the active area, a P-type surface implantation is then performed to form a body layer 35 (FIG. 15a), which extends within a surface portion of the wrinkled surface layer 9. Next, an N-type blanket implantation is performed on the surface of the wafer 1 (once again in the active area), to form a source layer 36, which is located in a surface portion of the body layer 35.

Figure 15B:
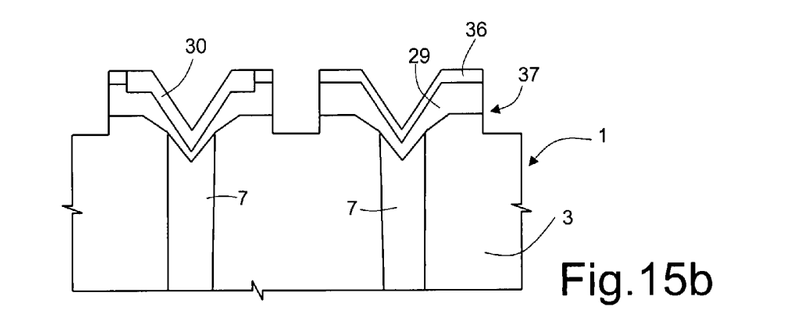

A deep implantation is then carried out to form deep-body regions, designated once again by 30, at the surface extensions of first columnar structures, and not in second columnar structures that alternate to the first columnar structures inside the epitaxial layer 3 (FIG. 15b). Next, in the connection portions 11 of the wrinkled surface layer 9 surface trenches 37 are opened, which traverse the connection portions 11 and reach the underlying epitaxial layer 3. The surface trenches 37 define body regions 29 of the transistor.

Figure 15C:
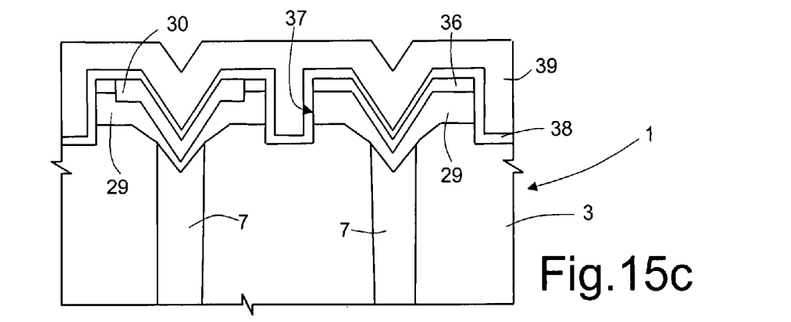

In the active area, a gate-oxide layer 38 is then grown on the wafer 1 (FIG. 15c), deposited on top of which is a polysilicon layer 39, of a conformable type, which fills the surface trenches 37.

Figure 15D:
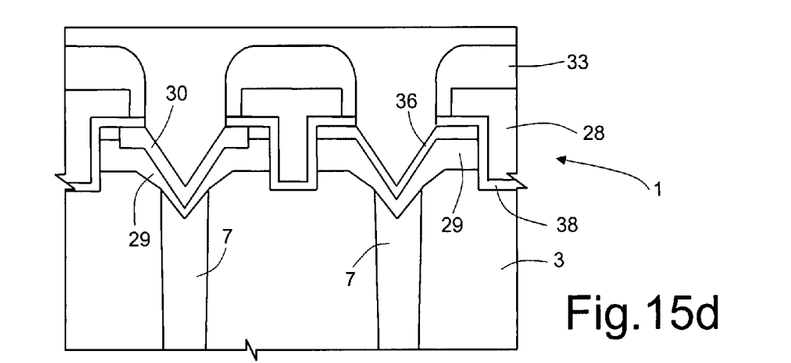

The polysilicon layer is then etched so as to obtain gate regions 28 in areas corresponding to the surface trenches 37 (FIG. 15d). This is followed by a process of deposition of a dielectric layer to form insulating regions 33 on the gate regions 28, and opening of the contacts. At the end of the manufacturing process a power MOSFET is consequently obtained on a non-planar surface, with oxide and channel regions in an area defined by a trench-formation process. In particular, the channel region extends vertically inside the body layer 35 between the source layer 36 and the epitaxial layer 3, at the sides of the surface trenches 37. The body region is in a non-planar area, inside the surface extension of a charge-balance columnar structure.

Figure 15E:
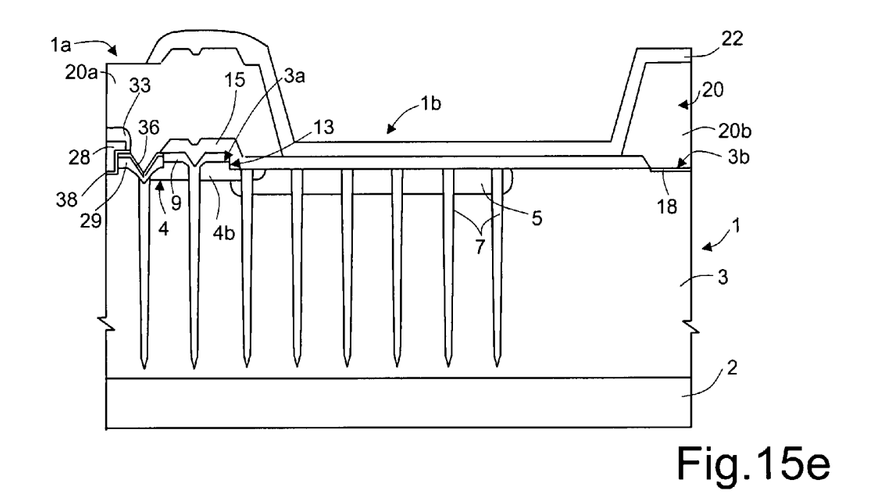

Shown in FIG. 15e is the final structure of the MOSFET with the corresponding edge structure, made with final steps of formation of the second doped region 18 for the cathode contact, metallization, and passivation, in a way similar to what has been described previously. In particular, the body region 29 of the last active cell (or stripe) of the transistor is connected to the edge portion 4b of the edge-termination structure.

Advantages of the described manufacturing process and of the resulting structures are clear from the foregoing description.

First, the process enables a charge-balance power diode and a corresponding efficient edge-termination structure to be obtained, which enables maximization of the performance in reverse biasing of the device.

The edge-termination structure can be easily integrated in power devices (for example, MOSFETs) based upon the charge-balance concept. In particular, the process described envisages removal in the edge area of the wrinkled surface layer that is formed after the formation of the charge-balance columnar structures, and the etching for this removal is calibrated so as to terminate inside a heavily doped region (the edge portion 4b of the first doped region 4), which represents a guard region against the concentrations of electrical field. The same heavily doped region connects an active region of the power device (for example an anode region in the case of the diode, or else a body region in the case of the MOSFET) with a ring region of the edge-termination structure. The resulting structure is consequently extremely efficient and enables prevention of breakdown phenomena of the power device (which can have a cut-off voltage that can even reach 1500 V, according to the thickness of the epitaxial layer).

Finally, it is clear that modifications and variations can be made to what is described and illustrated herein, without thereby departing from the scope of the present invention.

In particular, it is clear that, applying the concepts described, it is possible to obtain different power devices, for example an IGBT (insulated-gate bipolar transistor), a BJT, or a Schottky diode.

Furthermore, the possibility of obtaining dual structures, in which the charge balance is achieved by means of formation of N-doped columnar structures in a P-doped epitaxial layer is evident.

The columnar structures 7 may extend throughout the thickness of the epitaxial layer 3, terminating inside the substrate 2. As further alternative, a buffer layer, for example of an N type, can be provided between the substrate 2 and the epitaxial layer 3, and the columnar structures 7 may terminate in the buffer layer.

Furthermore, the concepts underlying the described process may be applied in a generic power device, in which it is provided, on the top surface of the wafer, a doped surface layer extending also in the edge area, envisaging etching and removal of said layer at the edge area, stopping the etching inside a heavily doped guard region, in order to limit breakdown phenomena.

A device formed according to an above-described process or otherwise having the above-described structure may be part of a circuit, such as a power supply, and the circuit may be part of a system, such as a computer system.

From the foregoing it will be appreciated that, although specific embodiments of the invention have been described herein for purposes of illustration, various modifications may be made without deviating from the spirit and scope of the invention.

What is claimed is:

1. A semiconductor structure, comprising:
    a layer having a first conductivity,
    a first section having a first surface, and a second section contiguous with the first section and having a second surface that is offset from the first surface;
    a first region having a second conductivity, disposed in the second section of the layer, and contiguous with the second surface; and
    second regions separated from each other having the second conductivity, disposed in the first region, contiguous with the second surface, and extending deeper into the layer than the first region.

2. The semiconductor structure of claim 1, further comprising:
    a substrate having the first conductivity; and
    wherein the layer comprises an epitaxial layer contiguous with the substrate.

3. The semiconductor structure of claim 1 wherein:
    the first conductivity comprises an N-type conductivity; and
    the second conductivity comprises a P-type conductivity.

4. The semiconductor structure of claim 1, further comprising a semiconductor device disposed in the first section of the layer.

5. The semiconductor structure of claim 1 wherein each of the second regions has a respective tapered end disposed in the layer beyond the first region.

6. The semiconductor structure of claim 1, further comprising a third region having the second conductivity, disposed in the first section of the layer, and contiguous with the first surface and the first region.

7. The semiconductor structure of claim 1 further comprising a third region having the second conductivity, disposed in the first section of the layer and extending into the second section.

8. The semiconductor structure of claim 1 wherein the first region extends into the first section and includes a portion disposed under the third region.

9. The semiconductor structure of claim 1, further comprising:
    a third region having the second conductivity, disposed in the first section of the layer, and contiguous with the first surface and the first region;
    anode regions having the second conductivity, disposed in the first section of the layer separate from the third region, and contiguous with the first surface;
    fourth regions each having the second conductivity, disposed in a respective one of the anode regions, and extending deeper into the layer than the respective anode region; and
    wherein the layer composes a cathode region.

10. The semiconductor structure of claim 1, further comprising
    a third region having the second conductivity, disposed in the first section of the layer, and contiguous with the first surface and the first region;
    a transistor body region having the second conductivity, disposed in the first section of the layer, and contiguous with the first surface and with the third region;
    a fourth region having the second conductivity, disposed in the third region, and extending deeper into the layer than the third region;
    a fifth region having the second conductivity, disposed in the first section of the layer, extending deeper into the layer than the body region, and contiguous with the body region; and
    wherein the layer composes a transistor drain region.

11. A semiconductor structure, comprising:
    a layer having a first conductivity, a first section having a first surface, and a second section contiguous with the first section and having a second surface;
    a first region having a second conductivity, disposed in the second section of the layer, and contiguous with the second surface; and
    second regions, each having a width and separated from each other and having the second conductivity, disposed in the first region, contiguous with the second surface and extending deeper into the layer than the first region at a depth greater than the width.

12. The semiconductor structure of claim 11 wherein:
    the first conductivity comprises an N-type conductivity; and
    the second conductivity comprises a P-type conductivity.

13. The semiconductor structure of claim 11, further comprising a semiconductor device disposed in the first section of the layer.

14. The semiconductor structure of claim 11, further comprising:
    a third region having the second conductivity, disposed in the first section of the layer, and contiguous with the first surface and the first region;
    anode regions having the second conductivity, disposed in the first section of the layer separate from the third region, and contiguous with the first surface;
    fourth regions each having the second conductivity, disposed in a respective one of the anode regions, and extending deeper into the layer than the respective anode region; and
    wherein the layer composes a cathode region.

15. A semiconductor power device, comprising:
    a body made of semiconductor material having a first top surface;
    an active region having a first type of conductivity, set in the proximity of said first top surface and inside an active portion of said body; and
    an edge-termination structure comprising a ring region having said first type of conductivity and a first doping level, set within a peripheral edge portion of said body and electrically coupled to said active region,
    wherein said edge-termination structure further comprises a guard region having said first type of conductivity and a second doping level, higher than said first doping level, set in the proximity of said first top surface and coupling said active region to said ring region; and wherein said body further has, at said peripheral edge portion, a second top surface set at a lower level with respect to said first top surface, and said guard region has inside it a step configuration such that at least a portion of the ring region is disposed directly below at least a portion of the active region so as to couple said first and second top surfaces.

16. The device according to claim 15, wherein said guard region has a body portion having a given thickness and set in contact with said active region up against said first top surface, and an end portion having a thickness smaller than said given thickness, separated from said body portion by said step and set in contact with said ring region up against said second top surface.

17. The device according to claim 15, wherein said active region extends as far as a first level, at least corresponding to said first top surface, and said ring region extends as far as a second level, lower than said first level and corresponding to said second top surface.

18. A semiconductor power device, comprising:
a body made of semiconductor material having a first top surface;
an active region having a first type of conductivity, set in the proximity of said first top surface and inside an active portion of said body; and
an edge-termination structure comprising a ring region having said first type of conductivity and a first doping level, set within a peripheral edge portion of said body and electrically coupled to said active region,
wherein said edge-termination structure further comprises a guard region having said first type of conductivity and a second doping level, higher than said first doping level, set in the proximity of said first top surface and coupling said active region to said ring region; and wherein said body further has, at said peripheral edge portion, a second top surface set at a lower level with respect to said first top surface, and said guard region has inside it a step configured so as to couple said first and second top surfaces;
further comprising a surface region having said first type of conductivity arranged on said first top surface in a position corresponding to and in contact with a body portion of said guard region; said surface region being non-planar, and said second top surface being planar and set in a position corresponding to an end portion of said guard region and to said ring region.

19. A semiconductor structure, comprising:
a layer having a first conductivity, a first section having a first surface, and a second section contiguous with the first section and having a second surface parallel to the first surface and that is offset from the first surface, wherein the first section has at least a first portion disposed directly over at least a first portion of the second section in a direction normal to the surfaces;
a first region having a second conductivity at a first dopant concentration, disposed in the second section of the layer, and contiguous with the second surface; and
second regions having the second conductivity at a second dopant concentration that is different than the first concentration, disposed in the first region, contiguous with the second surface, and extending deeper into the layer than the first region.

20. The semiconductor structure of claim 19, further comprising:
a substrate having the first conductivity; and
wherein the layer comprises an epitaxial layer contiguous with the substrate.

21. The semiconductor structure of claim 19 wherein:
the first conductivity comprises an N-type conductivity; and
the second conductivity comprises a P-type conductivity.

22. The semiconductor structure of claim 19, further comprising a semiconductor device disposed in the first section of the layer.

23. The semiconductor structure of claim 19, further comprising:
wherein the first surface has a substantially planar first surface portion;
wherein the second surface has a substantially planar second surface portion that is substantially parallel to the first surface portion; and
a sidewall disposed in the layer and extending between and substantially normal to the first and second surface portions.

24. The semiconductor structure of claim 19 wherein each of the second regions has a respective tapered end disposed in the layer beyond the first region.

25. The semiconductor structure of claim 19, further comprising:
a substrate having the first conductivity;
wherein the layer comprises an epitaxial layer contiguous with the substrate; and
wherein each of the second regions has a respective tapered end disposed in the substrate.

26. The semiconductor structure of claim 19, further comprising a third region having the second conductivity, disposed in the first section of the layer, and contiguous with the first surface and the first region.

27. The semiconductor structure of claim 19, further comprising:
a third region having the second conductivity, disposed in the first section of the layer, contiguous with the first surface and the first region, and having a third dopant concentration that is greater than the first dopant concentration.

28. The semiconductor structure of claim 19, further comprising:
an anode region having the second conductivity, disposed in the first section of the layer, and contiguous with the first surface and the first region;
third regions having the second conductivity, disposed in the anode region, and extending deeper into the layer than the anode region; and
wherein the layer composes a cathode region.

29. The semiconductor structure of claim 19, further comprising:
a third region having the second conductivity, disposed in the first section of the layer, and contiguous with the first surface and the first region;
anode regions having the second conductivity, disposed in the first section of the layer separate from the third region, and contiguous with the first surface;
fourth regions each having the second conductivity, disposed in a respective one of the anode regions, and extending deeper into the layer than the respective anode region; and
wherein the layer composes a cathode region.

30. The semiconductor structure of claim 19, further comprising
a third region having the second conductivity, disposed in the first section of the layer, and contiguous with the first surface and the first region;
a transistor body region having the second conductivity, disposed in the first section of the layer, and contiguous with the first surface and with the third region;

a fourth region having the second conductivity, disposed in the third region, and extending deeper into the layer than the third region;

a fifth region having the second conductivity, disposed in the first section of the layer, extending deeper into the layer than the body region, and contiguous with the body region; and wherein the layer composes a transistor drain region.

31. A semiconductor structure, comprising:

a layer having a first conductivity, a first section having a first surface, and a second section contiguous with the first section and having a second surface parallel to the first surface and that is offset from the first surface, wherein the first section has at least a first portion disposed directly over at least a first portion of the second section in a direction normal to the surfaces;

a first region having a second conductivity, disposed in the second section of the layer, and contiguous with the second surface; and second regions having the second conductivity, disposed in the first region, contiguous with the second surface and penetrating the second surface at a width, and extending deeper into the layer than the first region at a depth greater than the width.

32. The semiconductor structure of claim 31 wherein:

the first conductivity comprises an N-type conductivity; and the second conductivity comprises a P-type conductivity.

33. The semiconductor structure of claim 31, further comprising a semiconductor device disposed in the first section of the layer.

34. The semiconductor structure of claim 31, further comprising:

a third region having the second conductivity, disposed in the first section of the layer, and contiguous with the first surface and the first region;

anode regions having the second conductivity, disposed in the first section of the layer separate from the third region, and contiguous with the first surface;

fourth regions each having the second conductivity, disposed in a respective one of the anode regions, and extending deeper into the layer than the respective anode region; and wherein the layer composes a cathode region.

* * * * *